US011551991B2

(12) United States Patent
Yang et al.

(10) Patent No.: US 11,551,991 B2
(45) Date of Patent: Jan. 10, 2023

(54) SEMICONDUCTOR DEVICE PACKAGE HAVING COVER PORTION WITH CURVED SURFACE PROFILE

(71) Applicant: Western Digital Technologies, Inc., San Jose, CA (US)

(72) Inventors: Bo Yang, Dublin, CA (US); Chun Sean Lau, Penang (MY); Ning Ye, San Jose, CA (US); Shrikar Bhagath, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 127 days.

(21) Appl. No.: 16/894,068

(22) Filed: Jun. 5, 2020

(65) Prior Publication Data
US 2021/0384099 A1    Dec. 9, 2021

(51) Int. Cl.
H01L 23/367    (2006.01)
H01L 23/42    (2006.01)

(52) U.S. Cl.
CPC .......... H01L 23/3675 (2013.01); H01L 23/42 (2013.01)

(58) Field of Classification Search
None
See application file for complete search history.

(56) References Cited

U.S. PATENT DOCUMENTS

| 5,268,533 | A | 12/1993 | Kovacs et al. | |
|---|---|---|---|---|
| 2008/0142953 | A1 | 6/2008 | Mizunashi | |
| 2009/0059537 | A1* | 3/2009 | MacQuarrie | H01L 23/42 361/711 |
| 2010/0020503 | A1* | 1/2010 | Beaumier | H01L 23/3675 361/719 |

* cited by examiner

Primary Examiner — Jack S Chen
(74) Attorney, Agent, or Firm — Morgan, Lewis & Bockius, LLP

(57) ABSTRACT

A packaged semiconductor device includes a substrate, a heat-generating component positioned on a surface of the substrate, an enclosure at least partially surrounding the substrate and the heat-generating component, and a thermal interface material disposed between the heat-generating component and the enclosure. The enclosure includes a cover portion having a convexly curved surface configured to apply a pressure to the thermal interface material. The pressure may be substantially uniform over the area of the thermal interface material, or may be higher at a center of the thermal interface material than at a periphery of the thermal interface material.

6 Claims, 8 Drawing Sheets

SEMICONDUCTOR DEVICE PACKAGE HAVING COVER PORTION WITH CURVED SURFACE PROFILE

BACKGROUND

The present disclosure relates to semiconductor device packaging. In some embodiments, the present disclosure relates to an enclosure for a solid-state drive (SSD) package that provides thermal contact between a thermal interface material and one or more heat-generating components (e.g., NAND die, controller, or other semiconductor device) of the SSD.

A thermal interface material (TIM) may be used in a semiconductor devices to provide a short, passive, thermally conductive pathway between a heat-generating component and a package enclosure in order to conduct heat away from the heat-generating component and protect the component from overheating. The TIM may fill a gap between the heat-generating component and the package enclosure such that the TIM conducts heat from the heat-generating component to the package enclosure, which in turn can dissipate the heat to the surrounding environment.

TIMs are typically composed of materials having relatively high thermal conductivity and are available in different forms, including liquid TIMs (LTIMs) and sheet TIMs (STIMs). LTIMs include, for example, thermally conductive greases, gels, putties, and pastes that are applied as flowable substances. LTIMs can remain in a flowable state or, in some cases, be cured or hardened after application. LTIMs can offer particular advantages, for example, low modulus, good surface contact with the heat-generating component, and low residual stress that does not interfere with the structural performance of the SSD. However, LTIMs also have certain disadvantages such as requiring complex application, a multistep curing process, and/or frequent oil-bleeding problems.

In comparison, STIMs are solid, thermally conductive materials that can simplify the assembly process, allow easier handling, and avoid the oil-bleeding problems associated with LTIMs. However, since STIMs are solid materials, compression of the STIMs between the enclosure and the heat-generating components is required to maintain good thermal contact between these elements. Package enclosures typically include substantially flat (e.g., planar) internal surfaces that press against the STIMs to provide the desired compression. It has been found, however, that the compression from flat enclosure surfaces can generate non-uniform pressure on the underlying heat-generating components, the pressure typically being concentrated at the heat-generating components' corners and/or edges. Such non-uniform pressure can negatively affect solder joint reliability of the heat-generating components or result in other undesired and even detrimental consequences. Additionally, clamping/pinning down the enclosure over the STIMs with screws or other means may cause the enclosure to deform or bulge, potentially resulting in decreased thermal contact. It would therefore be advantageous to have a package enclosure that provides more uniform compression and improved thermal contact with the STIMs.

SUMMARY

The present disclosure, according to some embodiments, provides a package for a semiconductor device (e.g., an SSD) having an enclosure that is configured to avoid concentrating pressures at a periphery of a STIM or underlying components. A semiconductor device package according to some embodiments includes a substrate, at least one heat-generating component positioned on a surface of the substrate, and an enclosure at least partially surrounding the substrate and the at least one heat-generating component, the enclosure including a cover portion having a nonplanar surface facing toward the at least one heat-generating component. In some embodiments, the at least one heat-generating component includes a semiconductor integrated circuit. The at least one heat-generating component may include, for example, a non-volatile memory component (e.g., flash memory chip or NAND die), and/or a controller die. In some embodiments, a thermal interface material (e.g., STIM) is disposed between the nonplanar surface and the at least one heat-generating component and configured to conduct heat from the at least one heat-generating component to the cover portion.

In some embodiments, the nonplanar surface includes, at least partially, a convexly curved surface. For instance, in some embodiments, the convexly curved surface includes, at least partially, a spherically curved surface. In some embodiments, the thermal interface material is in direct contact with the at least one heat-generating component and the convexly curved surface. In some embodiments, the convexly curved surface is positioned and configured to apply a pressure to the thermal interface material. In some embodiments, the thermal interface material is compressed (e.g., 10% to 50%) between the at least one heat-generating component and the convexly curved surface. In some embodiments, the pressure applied to the thermal interface material is higher at a center of the thermal interface material than at a periphery (e.g., edge and/or corner) of the thermal interface material. In some embodiments, the pressure applied to the thermal interface material is substantially uniform over the thermal interface material. In some embodiments, the pressure applied to the thermal interface material is substantially uniform over a majority of the thermal interface material.

In further embodiments, a semiconductor device (e.g., an SSD) can include a substrate, a plurality of heat-generating components positioned on a surface of the substrate, each of the heat-generating components including contacts configured to make electrical contact with the substrate, and an enclosure at least partially surrounding the substrate and the plurality of heat-generating components. The plurality of heat-generating components may include semiconductor integrated circuits, for example, non-volatile memory components and/or controller dies. In some embodiments, the enclosure includes a cover portion having a plurality of pedestals, each pedestal extending towards a different one of the heat-generating components. In some embodiments, the semiconductor device further includes a plurality of thermal interface materials (e.g., STIMs), each of the plurality of thermal interface material being disposed between one of the heat-generating components and one of the pedestals. In some such embodiments, each of the pedestals includes a convexly curved surface configured to contact and apply a pressure to a different one of the thermal interface material. In some embodiments, the pressure applied to each of the thermal interface materials is higher at a center of the thermal interface material than at a periphery or edge of the thermal interface material. In some embodiments, the pressure applied to each of the thermal interface materials is substantially uniform across the thermal interface material. The convexly curved surface of the pedestals may include, at least partially, spherically curved surfaces.

In some embodiments, a packaged semiconductor device includes substrate means for providing electrical interconnections, an integrated circuit positioned on a surface of the substrate means, enclosure means for protecting the substrate means and the integrated circuit, and heat-conducting means for conducting heat from the integrated circuit to the enclosure means. In some embodiments, the heat-conducting means is disposed between and in contact with the integrated circuit and the enclosure means. In some embodiments, the enclosure means includes compression means having a convexly curved surface for applying a pressure to the heat-conducting means. In some embodiments, the integrated circuit includes contact means for electrically connecting the integrated circuit to the substrate means. In some embodiments, the integrated circuit includes memory means for storing data. In some embodiments, the semiconductor device further includes a controller for controlling the storage of data in the memory means, and a second heat-conducting means for conducting heat from the controller to the enclosure means. In some such embodiments, the enclosure means includes a second compression means having a convexly curved surface for applying a pressure to the second heat-conducting means.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be understood, however, that aspects of the present disclosure can be embodied in different forms and thus should not be construed as being limited to the embodiments set forth herein. Also, the elements illustrated in the accompanying drawings are not necessarily drawn to scale, but rather, may have been exaggerated to highlight the important features of the subject matter therein.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. For example, although a semiconductor device for a SSD is discussed, it will be apparent to those of skill in the art that the concepts disclosed herein have much broader application than just SSDs. Thus, these embodiments are provided to describe and enable one of skill in the art. The elements illustrated in the accompanying Figures are not necessarily drawn to scale, but rather, may have been exaggerated to highlight the important features of the subject matter therein. Furthermore, the Figures may have been simplified by omitting elements that are not necessarily needed for the understanding of the disclosed embodiments.

Figure 1:
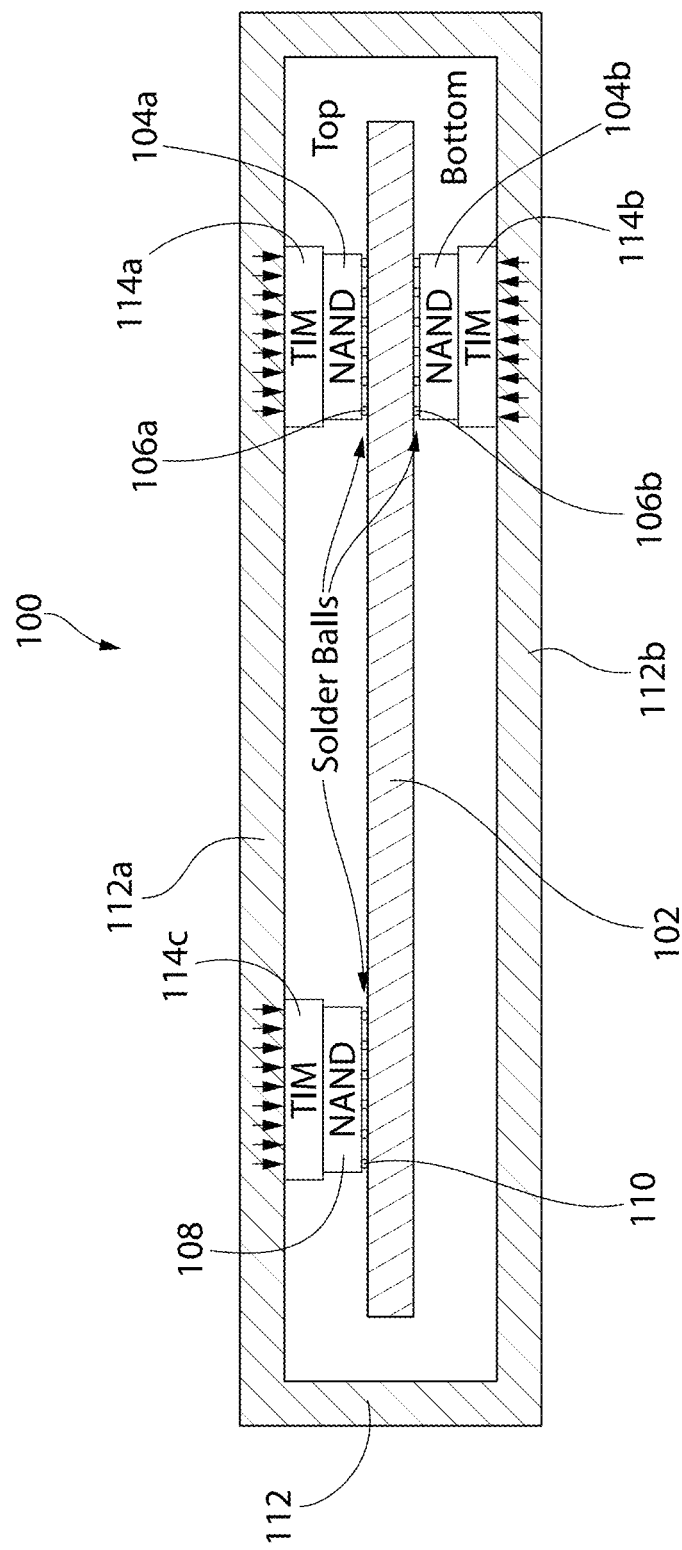
FIG. 1 is a diagram illustrating an example semiconductor device (e.g., SSD) including a substrate, a plurality of components connected to the substrate, an enclosure surrounding the substrate and components, and TIMs disposed between each component and the enclosure cover.

FIG. 1 is a diagram illustrating an example solid-state drive (SSD) 100. SSD 100 may include, for example, a substrate 102, such as a circuit board (e.g., a printed circuit board or PCB) having electronic circuitry on a top side, a bottom side, or both. SSD 100 may further include at least one non-volatile memory component (e.g., flash memory chip) for the storage of data, for example, NAND dies 104*a*, 104*b*, which are electrically connected to the circuitry of substrate 102 respectively via solder joint arrays 106*a*, 106*b*. In the illustrated example, NAND die 104*a* is positioned on a top side of substrate 102 and NAND die 104*b* is positioned on a bottom side of substrate 102. It should be noted that NAND dies 104*a*, 104*b* are not necessarily limited to this configuration and may be positioned at other locations on substrate 102 in other examples. For example, NAND dies 104*a*, 104*b* could be positioned adjacent to one another on the same side of substrate 102. It should also be noted that SSD 100 may include more than two NAND dies. As further shown in FIG. 1, SSD 100 includes at least one controller 108 (e.g., a flash memory controller, controller die), which may be configured to manage the data stored in NAND dies 104*a*, 104*b* and to communicate with a computer or other electronic device (not shown) to which SSD 100 may be connected during operation. Controller 108 may be electrically connected to the circuitry of substrate 102, including NAND dies 104*a*, 104*b*, via solder joint array 110, and may be positioned on either the top side of substrate 102 (as shown) or the bottom side of substrate 102. Disposed around substrate 102, NAND dies 104*a*, 104*b*, and controller 108 is an enclosure 112, which is configured to surround and protect the other components of SSD 100. Enclosure 112 may be made from, for example, a plastic material or more preferably metal. Enclosure 112 may include multiple portions or pieces, for example, a top cover 112a and a bottom cover 112b, which are secured together to form enclosure 112.

During operation, electronic components of SSD 100 generate heat. These heat-generating components can include semiconductor integrated circuits, for example, controller 108 and NAND dies 104a, 104b. In order to protect these components from overheating and/or to improve the performance of SSD 100, SSD 100 may include one or more means for dissipating heat away from these components. In the illustrated example, SSD 100 includes thermal interface material (TIM) positioned between one or more of the heat-generating components and enclosure 112, which is configured to provide a thermally conductive pathway from the one or more heat-generating components to the enclosure 112 to facilitate the dissipation of heat to the surrounding environment. The TIM includes a thermally conductive material that is positioned in a gap between a heat-generating component and enclosure 112. The TIM preferably has a thermal conductivity that is significantly greater than the thermal conductivity of air. As illustrated, SSD 100 may include a first TIM 114a disposed between NAND die 104a and enclosure 112, a second TIM 114b disposed between NAND die 104b and enclosure 112, and a third TIM 114c disposed between controller 108 and enclosure 112. TIMs 114a, 114b, and 114c may each be made from the same materials. For example, each of TIMs 114a, 114b, and 114c may be a sheet TIM (STIM), which comprise a flat solid sheet of thermally conductive material. To ensure good thermal contact, TIMs 114a, 114b, 114c are compressed against their respective heat-generating components (104a, 104b, 108) by enclosure 112. Compression may be between 10% to 50% by volume or thickness, for example. In some embodiments, the desired amount of compression is set forth by the necessary conditions for achieving sufficient thermal contact and for preventing mechanical collapse of the STIM and/or breakage of the solder joints underneath the heat-generating components, respectively.

It has been found that enclosures having substantially flat, planar surfaces may apply an uneven distribution of pressure on the STIMs and the underlying components. In particular, in some cases, the pressure may be concentrated at the periphery (e.g., edges and/or corners) of the STIMs and the underlying components. Such non-uniform pressure can negatively affect solder joint reliability of the underlying components or result in other detrimental consequences. This may occur when a load (e.g., shear force) that is not centered over each of the STIMs is applied to the enclosure, for example, when the enclosure is clamped, screwed, or otherwise mechanically secured at its edges/corners.

Figure 2A:
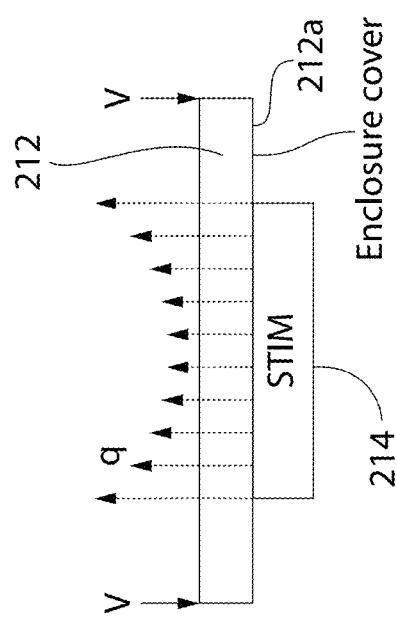
FIG. 2A is a diagram illustrating a portion of an enclosure cover having a planar surface in contact with a STIM, with arrows indicating relative pressure distribution q in response to a shear force V.
Figure 2B:
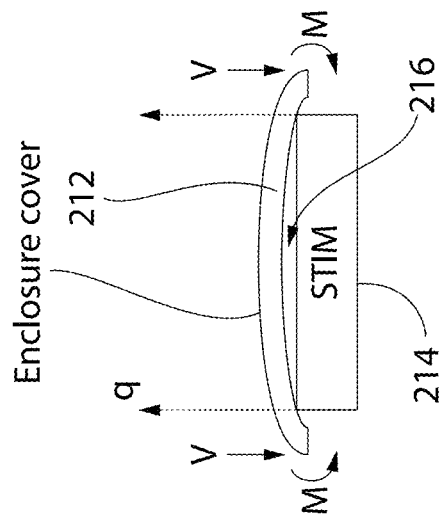
FIG. 2B is a diagram illustrating a portion of an enclosure cover in contact with a STIM, where the enclosure cover has developed a bulge in response to a shear force V and/or a bending moment M.

FIG. 2A is a representative diagram illustrating the pressure profile of an enclosure cover 212 having a planar internal surface 212a in contact with a STIM 214 under a shear force V. Arrows q indicate the relative pressure along the interface of STIM 214 with internal surface 212a of enclosure cover 212. As shown, longer arrows q indicate that pressure is highest at the edges/corners of STIM 214, whereas shorter arrows q indicate that pressure is lowest at the center of STIM 214. In some cases, as illustrated in FIG. 2B, enclosure cover 212 may bulge away from STIM 214 when enclosure cover 212 is under combined shear force V and moment M. When enclosure cover 212 forms a bulge, a separation 216 may occur between internal surface 212a and STIM 214, for example, at a middle portion of STIM 214. This separation 216 reduces the thermal contact of STIM 214 with enclosure cover 212 resulting in decreased heat dissipation. Furthermore, pressure may be concentrated at the edges and/or corners of STIM 214 where contact is made, which can negatively affect solder joint reliability of the underlying components.

Figure 3:
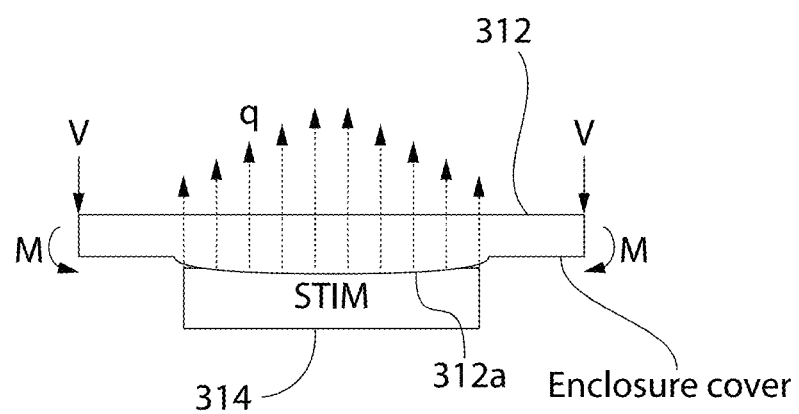
FIG. 3 is a diagram illustrating a portion of an enclosure cover having a nonplanar surface profile in accordance with certain embodiments in contact with a STIM, with arrows indicating relative pressure distribution q in response to a shear force V and/or a bending moment M.

FIG. 3 shows a portion of an enclosure cover 312 that, according to certain embodiments, can avoid concentrating pressure at the edges and/or corners of underlying STIM 314. In some embodiments, as shown in the illustration, enclosure cover 312 is configured such that when internal surface 312a contacts STIM 314 under shear force V and moment M, pressure q is higher at the center of STIM 314 than at the periphery of STIM 314. In other embodiments, enclosure cover 312 is configured such that the pressure is substantially uniform over the area of STIM 314, or substantially uniform over a majority of the area of STIM 314. In some embodiments, enclosure cover 312 is also configured to avoid bulging such that a gap does not form between a top surface of STIM 314 and enclosure cover 312. In contrast to enclosure 212, enclosure cover 312 includes a pedestal having an internal surface 312a for contacting STIM 314 that is non-planar. Internal surface 312a may be non-planar even when a shear force is not applied to the enclosure cover 312. In some embodiments, enclosure cover 312 has a thickness that increases from the edges of STIM 314 toward the center of STIM 314. In some embodiments, internal surface 312a of enclosure cover 312 includes at least a portion that is curved even when a shear force is not applied to the enclosure cover 312. In some embodiments, internal surface 312a of enclosure cover 312 includes at least a portion that is convexly curved. The curved portion may, for example, include a cylindrical curved surface, a spherical curved surface, an aspheric curved surface, or other curved geometry. In some embodiments, a vertex of the curved portion is positioned such that it contacts STIM 314 at or proximate to the center of the top surface of STIM 314.

In some embodiments, the curvature of internal surface 312a can be designed depending on a loading condition on the portion of enclosure cover 312 over STIM 314. In some embodiments, the deflection profile is calculated and is used to determine the internal surface profile. For example, consider a case of a plate representing an enclosure cover over a STIM subjected to equal force density V and equal moment density M at left and right edges (as shown in FIG. 3), with pressure q between the enclosure cover and STIM assumed to be uniform. The deflection profile δ may be given by equation (1):

$$\delta = \frac{qx}{2E(1-v^2)h^3}(L^3 - 2Lx^2 + x^3) + \frac{6Mx}{E(1-v^2)h^3}(L-x) \quad (1)$$

where E and v are Young's modulus and Poisson ratio, h is the thickness, and L is the length of bending. In some embodiments, a uniform bending curvature may be assumed, and calculated with the maximum deflection, to define the surface profile of the internal surface of the enclosure cover.

A sample calculation is given below. Assume an enclosure cover thickness h=1 mm, E=100 GPa, v=0.3, L=5 mm; and loading q=10 MPa and M=0 (V=q*L/2). The resulting maximum deflection is equal to 10.7 μm. Such surface curvature can be fabricated with little practical difficulty.

Figure 4:
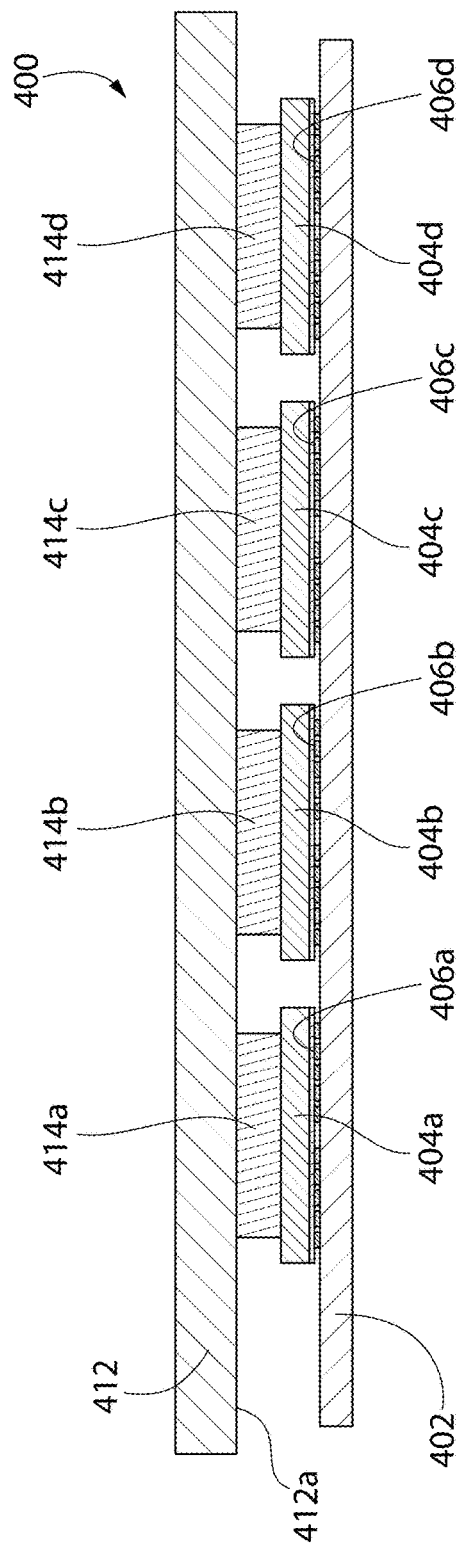
FIG. 4 is a diagram illustrating a portion of a semiconductor device (e.g., an SSD) including an enclosure with a planar surface contacting STIMs positioned over a plurality of components connected to a substrate.
Figure 5:
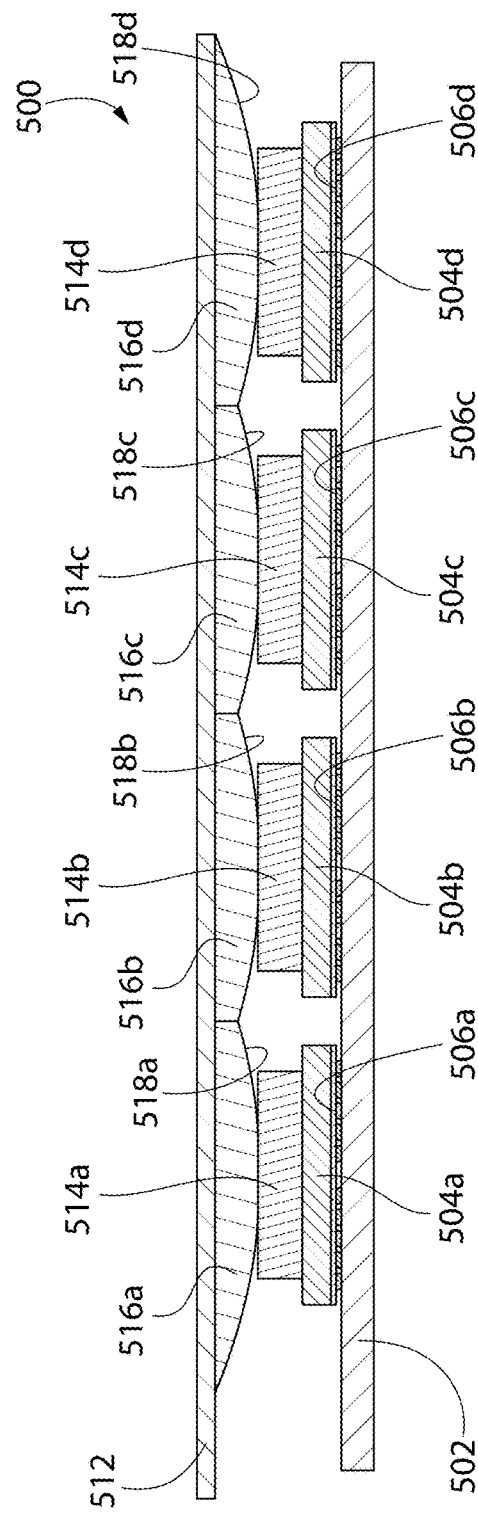
FIG. 5 is a diagram illustrating a portion of a semiconductor device (e.g., an SSD) including an enclosure with pedestals having nonplanar surfaces contacting STIMs positioned over a plurality of components connected to a substrate in accordance with certain embodiments.

For further comparison, FIGS. 4 and 5 each show a portion of a packaged semiconductor device (e.g., an SSD) including an enclosure either with a planar internal surface (FIG. 4) or with pedestals having nonplanar surfaces (FIG. 5) in contact with STIMs positioned over a plurality of components connected to a substrate. More particularly, FIG. 4 illustrates a portion of SSD 400 that includes a substrate 402, such as a circuit board (e.g., a printed circuit board or PCB), and four heat-generating components 404a, 404b, 404c, 404d that are connected to substrate 402 by solder joint arrays 406a, 406b, 406c, 406d, respectively. Heat-generating components 404a, 404b, 404c, 404d may include, for example, non-volatile memory components for the storage of data (e.g., NAND dies or other flash memory chips). Heat-generating components 404a, 404b, 404c, 404d may also include at least one controller (e.g., a flash memory controller, controller die), which may be configured to manage the data stored in the other components and to communicate with a computer or other electronic device (not shown) to which SSD 400 may be connected during operation. Positioned above heat-generating components 404a, 404b, 404c, 404d are STIMs 414a, 414b, 414c, 414d, respectively, which are configured to conduct heat away from heat-generating components 404a, 404b, 404c, 404d to enclosure cover 412 during operation. Enclosure cover 412 includes a substantially flat internal surface 412a which contacts and presses against STIMs 414a, 414b, 414c, 414d.

FIG. 5 illustrates a portion of SSD 500. In some embodiments, SSD 500 may be similar to SSD 400 in that SSD 500 includes a substrate 502, such as a circuit board (e.g., a printed circuit board or PCB), and heat-generating components 504a, 504b, 504c, 504d that are connected to substrate 502 by solder joint arrays 506a, 506b, 506c, 506d, respectively. Heat-generating components 504a, 504b, 504c, 504d, may include, for example, non-volatile memory components for the storage of data (e.g., NAND dies or other flash memory chips). Heat-generating components 504a, 504b, 504c, 504d may also include at least one controller (e.g., a flash memory controller, controller die), which may be configured to manage the data stored in the other components and to communicate with a computer or other electronic device (not shown) to which SSD 500 may be connected during operation. While four heat-generating components are shown in the illustrated embodiment, it should be noted that SSD 500 may have more or fewer than four heat-generating components in other embodiments. Positioned above heat-generating components 504a, 504b, 504c, 504d are STIMs 514a, 514b, 514c, 514d, respectively, which are configured to conduct heat away from heat-generating components 504a, 504b, 504c, 504d to enclosure cover 512 during operation.

Unlike SSD 400, the enclosure cover 512 of SSD 500 includes pedestals 516a, 516b, 516c, 516d, each having at least a partially nonplanar surface 518a, 518b, 518c, 518d for contacting STIMs 514a, 514b, 514c, 514d. Surfaces 518a, 518b, 518c, 518d, in some embodiments, may include curved surfaces, for example, convexly curved surfaces. The curved surface, in some embodiments, may include a cylindrical curved surface, a spherical curved surface, an aspheric curved surface, or other curved geometry. In some embodiments, one or more of surfaces 518a, 518b, 518c, 518d may be configured similarly as internal surface 312a discussed above.

Figure 6:
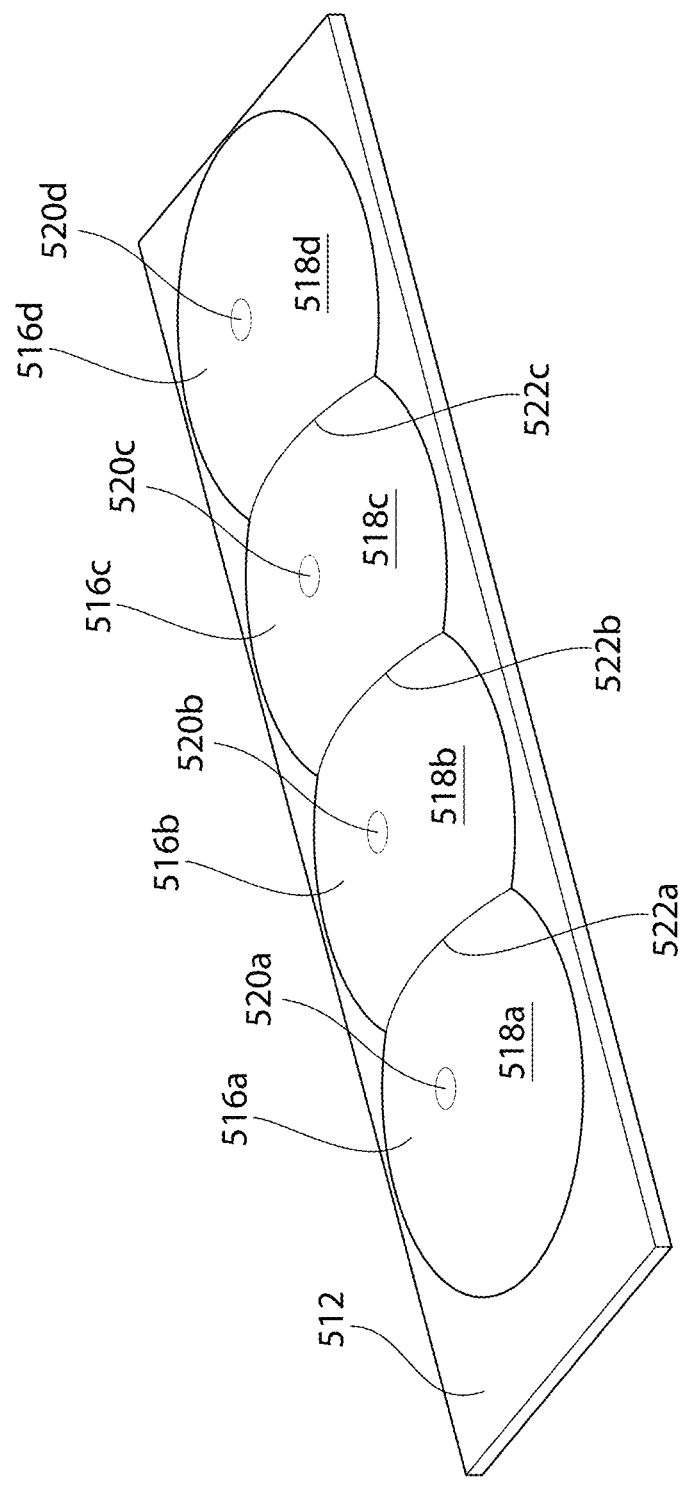
FIG. 6 is a perspective view showing the internal side of an enclosure cover used in the semiconductor device of FIG. 5.

FIG. 6 provides a perspective view showing the internal side of an enclosure cover 512 used in SSD 500 according to certain embodiments. In some embodiments, pedestals 516a, 516b, 516c, 516d are spaced and arranged based on the arrangement of heat-generating components 504a, 504b, 504c, 504d on substrate 502. In some embodiments, pedestals 516a, 516b, 516c, 516d are spaced and arranged such that each pedestal is configured to contact a separate STIM. Pedestals 516a, 516b, 516c, 516d may have a linear arrangement, for example, or be arranged in an array. While four pedestals are shown in the illustrated embodiment, it should be noted that enclosure cover 512 may have more or fewer than four pedestals in other embodiments, depending on the number of heat-generating components.

In some embodiments, as shown in FIG. 6, surfaces 518a, 518b, 518c, 518d of pedestals 516a, 516b, 516c, 516d may be, at least partially, spherical surfaces. In some embodiments, one or more of surfaces 518a, 518b, 518c, 518d may also include a flattened or truncated portion 520a, 520b, 520c, 520d. Flattened or truncated portions 520a, 520b, 520c, 520d may be located at or proximate to an apex of surfaces 518a, 518b, 518c, 518d, respectively. In some embodiments, flattened or truncated portions 520a, 520b, 520c, 520d may be positioned and configured to contact STIMs 514a, 514b, 514c, 514d at or proximate their centers. In some embodiments, flattened or truncated portions 520a, 520b, 520c, 520d may have a radius that is, for example, up to 15% of a maximum radius of pedestals 516a, 516b, 516c, 516d. In further embodiments, two or more of surfaces 518a, 518b, 518c, 518d may intersect at a junction 522a, 522b, 522c. In some embodiments where surfaces 518a, 518b, 518c, 518d include spherical surfaces, junctions 522a, 522b, 522c may be defined as circular arcs where the spherical surfaces of two adjacent pedestals intersect.

Figure 7:
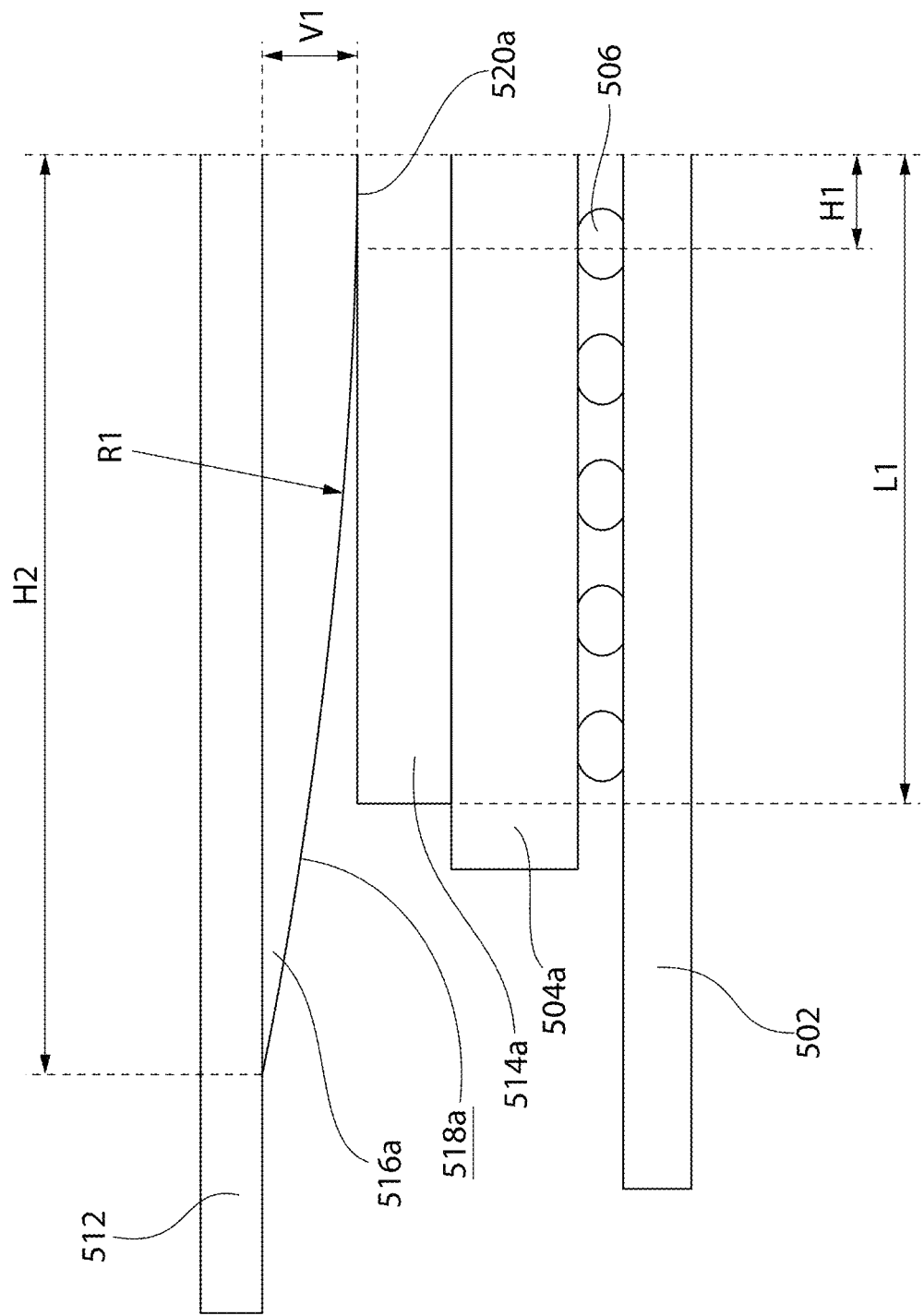
FIG. 7 is a diagram showing example dimensions of an enclosure pedestal in accordance with certain embodiments.

FIG. 7 provides example dimensions for a portion of SSD 500 showing pedestal 516a over STIM 514a and heat-generating component 504a according to some embodiments. In this illustration, L1 represents half the length of STIM 514a, H2 represents the maximum radius of pedestal 516a, V1 represents the maximum height of pedestal 516a, H1 represents the radius of flattened or truncated portion 520a, and R1 represents the radius of curvature for a spherically curved portion of surface 518a. In some embodiments, certain dimensions of pedestal 516a may be chosen to be a particular ratio with respect to length L1. In some embodiments, H1 may be selected to be from 0.12×L1 to 0.18×L1, for example, 0.15×L1. In some embodiments, H2 may be selected to be from 1.2×L1 to 1.8×L1, for example, 1.5×L1. In some embodiments, V1 may be selected to be from 0.05×L1 to 0.3×L1. In some embodiments, R1 may be selected to be from 3×L1 to 15×L1. In further embodiments, H2 may be about 10×H1 and/or about 5×V1. In some embodiments, L1 may have a value from about 5 mm to about 10 mm, for example. L1 may have a value less than 5 mm or greater than 10 mm in other examples. In one non-limiting example, the dimensions may have the values provided in Table 1 below.

TABLE 1

| Example Dimensions | |
|---|---|
| Dimension | Value |
| L1 | 7.2 mm |
| H1 | 1 mm |
| H2 | 10 mm |
| V1 | 2 mm |
| R1 | 24 mm |

Figure 8:
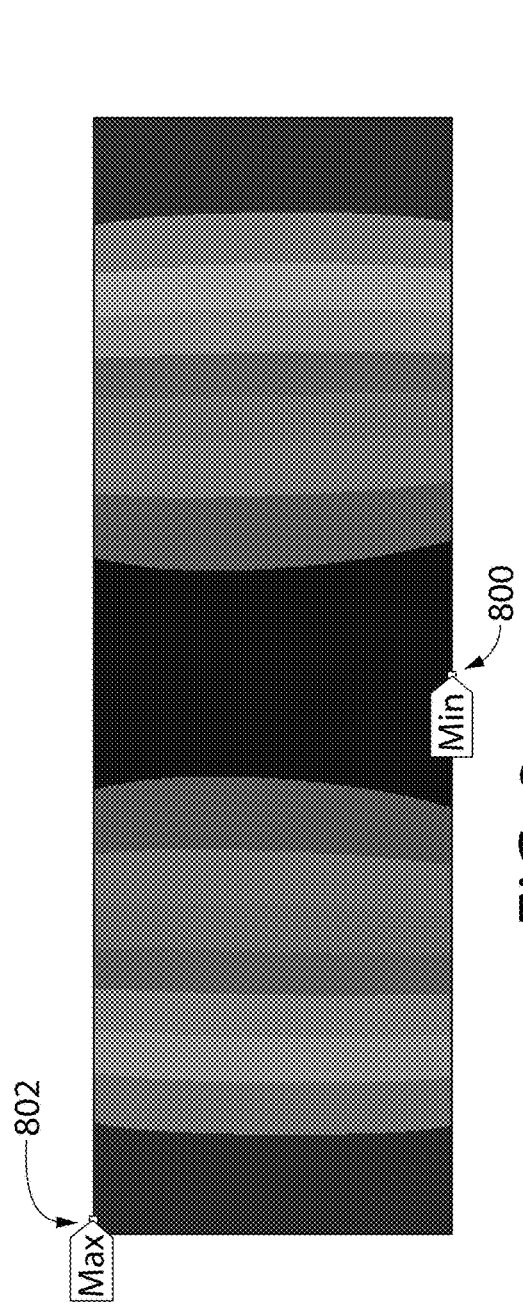
FIG. 8 is a simulated deflection map showing the deflection amounts of the enclosure cover used in the semiconductor device of FIG. 4 when the STIMs are at 40% compression.
Figure 9:
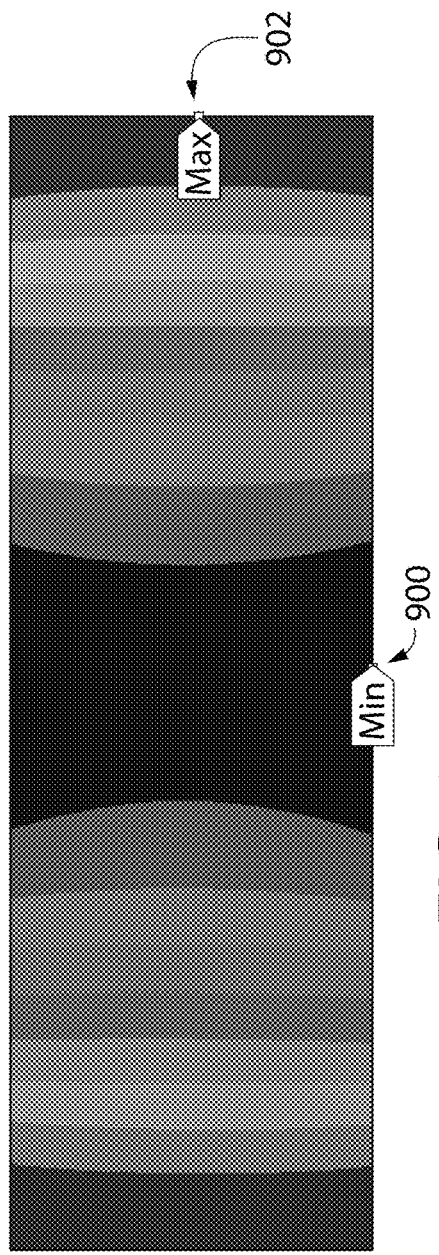
FIG. 9 is a simulated deflection map showing the deflection amounts of the enclosure cover used in the semiconductor device of FIG. 5 when the STIMs are at 40% compression.

Simulations were conducted to compare the effects of enclosure covers 412 and 512 used in SSD 400 (FIG. 4) and SSD 500 (FIG. 5). FIGS. 8 and 9 indicate the deflection amounts (in mm) of the enclosure covers 412, 512, respectively, when the underlying STIMs are at 40% compression. In both FIGS. 8 and 9 the minimum deflections were measured proximate to the centers of the enclosure covers, and the maximum deflections were measured proximate to the sides of the enclosure covers. In FIG. 8, the minimum deflection was measured at point 800, with a value of 0.67068 mm, and the maximum deflection was measured at point 802, with a value of 0.8002 mm. The difference between the maximum deflection and the minimum deflection was 0.12952 mm. In FIG. 9, the minimum deflection was measured at point 900, with a value of 0.71388 mm, and the maximum deflection was measured at point 902, with a value of 0.80002 mm. The difference between the maximum deflection and the minimum deflection was 0.08614 mm. These data show that enclosure cover 512 (with pedestals including curved contact surfaces) can produce a significantly smaller difference in deflection (maximum deflection−minimum deflection) when compared to enclosure cover 412 (having a flat contact surface). In particular, the difference in deflection shown in FIG. 9 is about 33% less than the difference in deflection shown in FIG. 8.

Figure 10:
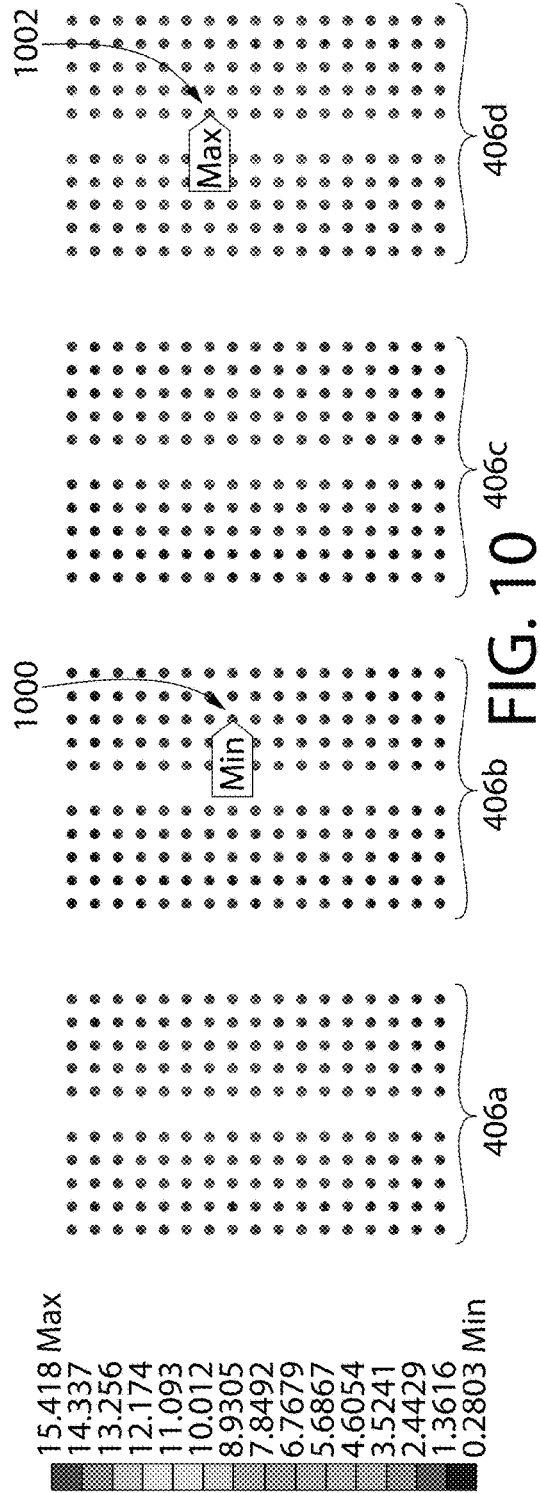
FIG. 10 is a simulated pressure map showing the calculated pressures on the component solder joints in the semiconductor device of FIG. 4 when the STIMs are at 40% compression.
Figure 11:
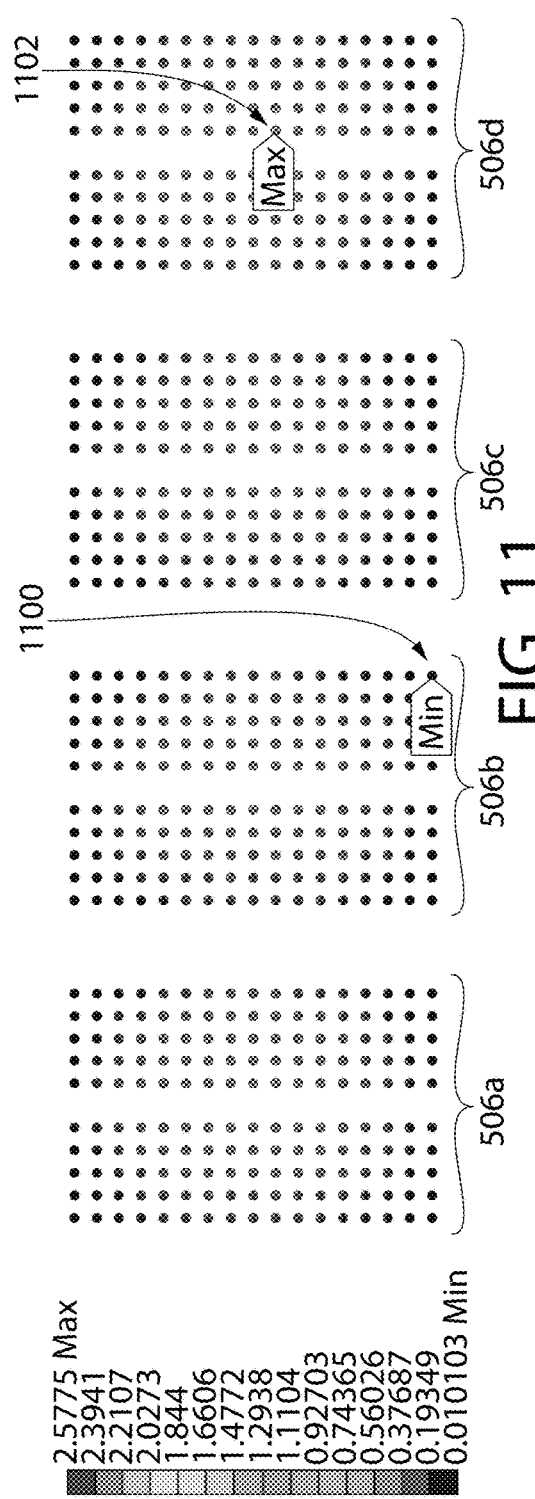
FIG. 11 is a simulated pressure map showing the calculated pressures on the component solder joints in the semiconductor device of FIG. 5 when the STIMs are at 40% compression.

FIGS. 10 and 11 show the pressure (in MPa) against solder joint arrays 406a, 406b, 406c, 406d in SSD 400 and solder joint arrays 506a, 506b, 506c, 506d in SSD 500, respectively, when the underlying STIM are at 40% compression. In FIG. 10, the minimum pressure was measured at point 1000, with a value of 0.2803 MPa, and the maximum pressure was measured at point 1002, with a value of 15.418 MPa. The difference between the maximum pressure and the minimum pressure was about 15.1377 MPa. In FIG. 11, the minimum pressure was measured at point 1100, with a value of 0.010103 MPa, and the maximum pressure was measured at point 1102, with a value of 2.5775 MPa. The difference between the maximum pressure and the minimum pressure was about 2.5674 MPa. These data show that enclosure cover 512 (with pedestals including curved contact surfaces) can produce a significantly smaller difference in pressure (maximum pressure−minimum pressure) when compared to enclosure cover 412 (having a flat contact surface), and can produce a more even pressure distribution on the underlying components.

While certain embodiments described herein are illustrative of packaging particularly useful for solid-state drives, the embodiments described herein are not necessarily limited to this use. Other semiconductor devices or electronics that utilize thermal interface materials (e.g., STIMs) may also benefit from aspects of the present disclosure. For example, the non-planar surfaces described for the enclosures of the present disclosure may also be utilized in other devices or components that are arranged to contact and/or apply a pressure to a thermal interface material, for example, other heat sinks, heat spreaders, or the like.

It should be understood that various changes, substitutions, and alterations can be made herein without departing from the spirit and scope of the invention as defined by the appended claims. It should also be apparent that individual elements identified herein as belonging to a particular embodiment may be included in other embodiments of the invention. Moreover, the scope of the present application is not intended to be limited to the particular embodiments of the process, machine, manufacture, and composition of matter, means, methods and steps described in the specification. The scope of the invention also is not meant to be limited by the title or the abstract, as these parts of the application are provided to facilitate searching specific features disclosed herein. As one of ordinary skill in the art will readily appreciate from the disclosure, processes, machines, manufacture, composition of matter, means, methods, or steps, presently existing or later to be developed that perform substantially the same function or achieve substantially the same result as the corresponding embodiments described herein may be used according to the present invention.

What is claimed is:

1. A solid-state drive, comprising:
   a substrate;
   a plurality of heat-generating components positioned on a surface of the substrate, each of the heat-generating components including contacts configured to make electrical contact with the substrate;
   an enclosure at least partially surrounding the substrate and the plurality of heat-generating components, the enclosure including a cover portion having a plurality of pedestals, each pedestal extending toward a different one of the heat-generating components; and
   a plurality of thermal interface materials, each of the plurality of thermal interface materials being disposed between one of the heat-generating components and one of the pedestals,
   wherein each of the pedestals includes a convexly curved surface configured to contact and apply a pressure to a different one of the thermal interface materials.

2. The solid-state drive of claim 1, wherein the convexly curved surface includes, at least partially, a spherically curved surface.

3. The solid-state drive of claim 1, wherein each of the thermal interface materials is in direct contact with one of the heat-generating components and one of the pedestals.

4. The solid-state drive of claim 1, wherein the pressure applied to each of the thermal interface materials is higher at a center of each of the thermal interface materials than at an edge of each of the thermal interface materials.

5. The solid-state drive of claim 1, wherein the plurality of heat-generating components comprises at least one non-volatile memory component and at least one controller die.

6. The solid-state drive of claim 1, wherein the plurality of thermal interface materials comprises sheet thermal interface materials.

* * * * *